(12) United States Patent
Blatchford et al.

(10) Patent No.: US 7,745,067 B2
(45) Date of Patent: Jun. 29, 2010

(54) METHOD FOR PERFORMING PLACE-AND-ROUTE OF CONTACTS AND VIAS IN TECHNOLOGIES WITH FORBIDDEN PITCH REQUIREMENTS

(75) Inventors: James Walter Blatchford, Richardson, TX (US); Scott William Jessen, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1324 days.

(21) Appl. No.: 11/191,078

(22) Filed: Jul. 28, 2005

(65) Prior Publication Data

US 2007/0028200 A1 Feb. 1, 2007

(51) Int. Cl.
*G03F 1/00* (2006.01)
(52) U.S. Cl. .................. 430/5; 430/311; 430/394; 716/19; 716/21
(58) Field of Classification Search .............. 430/5, 430/311, 394; 716/9–21
See application file for complete search history.

(56) References Cited

U.S. PATENT DOCUMENTS

| 6,855,486 | B1 * | 2/2005 | Finders et al. | 430/394 |
| 6,928,633 | B1 * | 8/2005 | Teig et al. | 716/14 |
| 2004/0180294 | A1 * | 9/2004 | Baba-Ali et al. | 430/311 |

* cited by examiner

*Primary Examiner*—Mark F Huff
*Assistant Examiner*—Rashid Alam
(74) *Attorney, Agent, or Firm*—Warren L. Franz; Wade J. Brady, III; Frederick J. Telecky, Jr.

(57) ABSTRACT

Provide is a method of making a mask layout, an integrated circuit device made by a method, a computer readable medium, and a mask for forming contact holes. The method can comprise patterning a first feature along a first axis, determining a first set of areas adjacent to the first feature, wherein each of the areas in the first set of areas is within a first angle away from the first axis, and wherein each of the areas in the first set of areas is within a first distance away from the first feature, and patterning a second feature in at least one of the first set of areas so as to form a mask layout, wherein each of the first feature and the second feature are one of a virtual feature and a real feature.

32 Claims, 5 Drawing Sheets

US 7,745,067 B2

METHOD FOR PERFORMING PLACE-AND-ROUTE OF CONTACTS AND VIAS IN TECHNOLOGIES WITH FORBIDDEN PITCH REQUIREMENTS

FIELD OF THE INVENTION

The subject matter of this application relates to photolithography for forming integrated circuit devices. More particularly, the subject matter of this application relates to methods and devices used to overcome forbidden pitch problems when conducting photolithography and to integrated circuit devices formed using the methods and devices.

BACKGROUND OF THE INVENTION

Lithographic projection apparatus (tools) can be used, for example, in the manufacture of integrated circuits (ICs). When using the various tools, a mask can be used that contains a circuit pattern corresponding to an individual layer of the IC, and this pattern, usually having many features, can be imaged onto a target portion (e.g., comprising one or more dies) on a substrate, such as a silicon or other wafer comprising a semiconductor, that has been coated with a layer of radiation-sensitive material, such as a resist. In general, a single wafer may contain a network of adjacent target portions that can be successively irradiated using a projection system of the tool, one at a time. In one type of lithographic projection apparatus, each target portion is irradiated by exposing the entire mask pattern onto the target portion in one shot. In another apparatus, which is commonly referred to as a step-and-scan apparatus, each target portion is irradiated by progressively scanning the mask pattern under the projection beam in a given reference direction (the "scanning" direction) while synchronously scanning the substrate table parallel or anti-parallel to the scanning direction. Because the projection system typically has a magnification factor M, which is generally less than 1, the speed V at which the substrate table is scanned will be a factor M times that at which the mask table is scanned. More information with regard to lithographic apparatus can be found, for example, in U.S. Pat. No. 6,046,792, which is incorporated by reference herein in its entirety.

In a manufacturing process using a lithographic projection apparatus, a mask pattern can be imaged onto a substrate that is at least partially covered by a layer of resist. Prior to this imaging step, the substrate may undergo various procedures, such as, priming, resist coating, and a soft bake. After exposure, the substrate can be subjected to other procedures, such as a post-exposure bake (PEB), development, a hard bake, and a measurement/inspection of the image features. This array of procedures can be used as a basis to pattern an individual layer of a device, such as an IC. Such a patterned layer may then undergo various processes, such as etching, ion-implantation, doping, metallization, oxidation, chemical mechanical polishing (CMP), etc., all intended to complete an individual layer. If several layers are required, then part of all of the procedure, or a variant thereof, may need to be repeated for each new layer. Eventually, an array of devices can be present on the substrate. These devices can then be separated from one another by a technique such as dicing or sawing. Thereafter, the individual devices can be mounted on a carrier, connected to pins, etc.

The lithographic tool may be of a type having two or more substrate tables (and/or two or more mask tables). In such "multiple stage" devices, the additional tables may be used in parallel, or preparatory steps may be carried out on one or more tables while one or more other tables are being used for exposure.

The photolithography masks referred to above comprise geometric patterns, also called features, corresponding to the circuit components or structures to be integrated onto a substrate. The patterns used to create such masks are typically generated using computer-aided design (CAD) programs, sometimes called electronic design automation (EDA). Most CAD programs follow a set a predetermined design rules in order to create functional masks. These rules are set by processing and design limitations. For example, design rules can define the space tolerance between circuit devices, such as gates, capacitors, etc., or interconnect lines, so as to ensure that the circuit devices or lines do not interact with one another in an undesirable way.

One of the goals in IC fabrication is to faithfully reproduce the original circuit design on the wafer using the mask. Another goal is to use as much of the wafer real estate as possible. As the size of an IC is reduced and its density increases, however, the critical dimension (CD) of its corresponding mask pattern approaches the resolution limit of the optical exposure tool. The resolution for an exposure tool can be defined as the minimum feature sizes that the exposure tool can repeatedly expose on the wafer. The resolution value of present exposure tools often constrains the CD for many advanced IC designs.

In some circuits in which the size of the circuit features approach the optical limits of the lithography process, one or more resolution enhancement techniques can be used to improve the accuracy of the pattern transfer from the layout to the wafer. For example, as the size of integrated circuit features drops to 0.18 μm and below, the features can become smaller than the wavelength of light used to create such features, thereby creating lithographic distortions when printing the structures onto the wafer. Resolution enhancement techniques (RETs) can compensate for such lithographic distortions. Such RETs may include, for example, optical proximity correction, phase shifting, and off-axis illumination.

Although RETs can improve the wafer printability, RETs can be pitch sensitive. Pitch can be defined as a distance between a centerline of one feature (or structure) to the centerline of an adjoining feature (or structure). As such, pitch can be a relative measure of whether a design is characterized as having isolated features (or structures) or densely populated features (or structures).

Unfortunately, when using a RET, certain pitches in a design may result in significant degradation of image quality. A threshold pitch can be assigned, as defined by, for example, contrast, size of a process window, mask error factor, or some other parameter, such that pitches greater than the threshold produce satisfactory features (or structures) and pitches smaller than the threshold produce unsatisfactory features (or structures). An unsatisfactory pitch can be described as a "forbidden pitch."

Additional factors in combination with the pitch can also affect the image quality. For example, two dimensional (2D) factors such as the proximity, size, and/or shape of the features near the features of interest can affect image quality.

Thus, there is a need to overcome these and other problems of the prior art to provide mask patterns that can work beyond the typical forbidden pitch.

SUMMARY OF THE INVENTION

In accordance with an embodiment of the invention, there is a method of making a mask layout for forming contact holes on a semiconductor device. The method can comprise patterning a first feature along a first axis, determining a first set of areas adjacent to the first feature, wherein each of the areas in the first set of areas is within a first angle away from the first axis, and wherein each of the areas in the first set of areas is within a first distance away from the first feature, and patterning a second feature in at least one of the first set of areas so as to form a mask layout, wherein each of the first feature and the second feature are one of a virtual feature and a real feature.

In accordance with another embodiment of the invention, there is another method of making a mask layout. The method can comprise positioning a plurality of features on a layout, wherein the plurality of features comprises a first feature, wherein the first feature is positioned along a first axis and a second axis orthogonal to the first axis, and a plurality of additional features, wherein each of the additional features is positioned on an axis parallel to the first axis and on an axis parallel to the second axis. The method can also comprise determining a first set of areas adjacent to the first feature, wherein each of the areas in the first set of areas is defined by a distance ($d_1$) to a distance ($d_2$) away from the first feature and within a first angle away from one of the first axis and the second axis, and wherein each one of the areas in the first set of areas comprises one of the plurality of additional features and patterning one of a contact hole feature and a sub-resolution assist feature (SRAF) in the position of the first feature and the additional features.

According to another embodiment of the invention, there is an integrated circuit device formed according to the method comprising providing a transparent substrate having a mask design disposed, the mask design comprising a first feature to be imaged on a substrate, wherein the first feature is positioned along a first axis and a second axis, and a second feature, wherein the second feature is positioned from about 100 nm to about 200 nm away from the first feature, and wherein the second feature is positioned from about ±15 degrees from one of the first axis and the second axis, and wherein the second feature is one of a sub-resolution assist feature and a feature to be imaged on the substrate. The method for making the integrated circuit device can also comprise exposing the transparent mask to a light source so as to image the mask design on the substrate.

According to another embodiment of the invention, there is a computer readable medium containing program code that configures a processor to perform a method of making a mask layout for forming contact holes on a semiconductor device. The computer readable medium can comprise program code for patterning a first feature along a first axis, program code for determining a first set of areas adjacent to the first feature, wherein each of the areas in the first set of areas is within a first angle away from the first axis, and wherein each of the areas in the first set of areas is within a first distance away from the first feature, and program code for patterning a second feature in at least one of the first set of areas so as to form a mask layout, wherein each of the first feature and the second feature are one of a virtual feature and a real feature.

According to still another embodiment of the invention, there is a mask for use in the manufacture of an integrated circuit. The mask can comprise a transparent substrate having a mask design, the mask design comprising a first feature to be imaged on a substrate, wherein the first feature is positioned along a first axis and a second axis and a second feature. The second feature can be positioned from about 100 nm to about 200 nm away from the first feature wherein the second feature is positioned from about ±15 degrees from one of the first axis and the second axis, and the second feature can be one of a sub-resolution assist feature and a feature to be imaged on the substrate.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Figure 1:
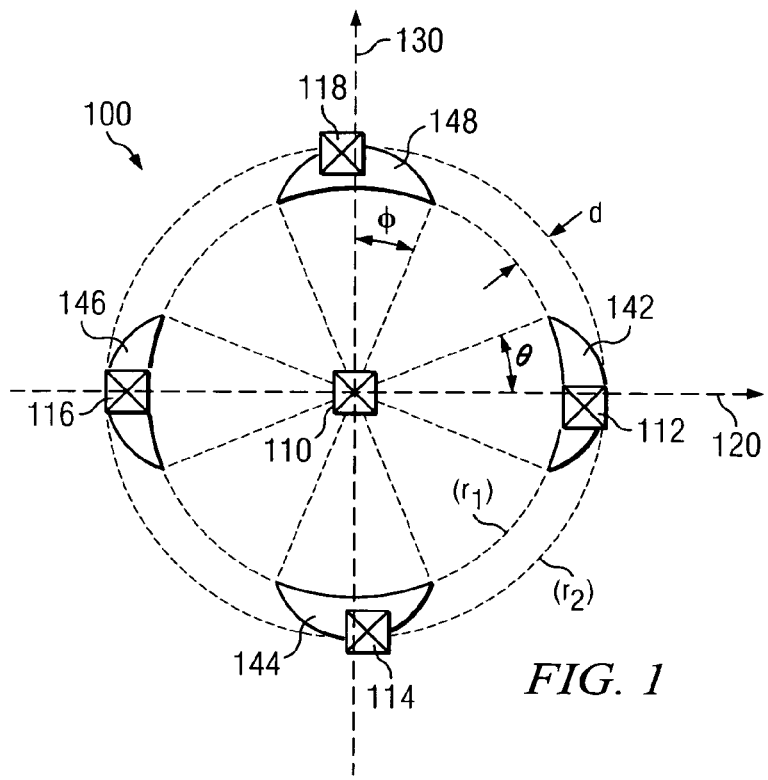
FIG. 1 depicts a portion of an exemplary mask layout for use in forming an integrated circuit device according to various embodiments of the present invention.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Although reference is made herein to the use of the invention in the manufacture of ICs, it is to be understood that the invention has many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "reticle", "wafer", or "die" in this text should be considered as being replaced by the more general terms "mask", "substrate", and "target portion", respectively.

In the present disclosure, the term "radiation" is used to encompass all types of electromagnetic radiation, including ultraviolet radiation (e.g., with a wavelength of, for example, 365, 248, 193, 157, or 126 nm) and extreme ultraviolet radiation (e.g., with a wavelength of, for example in the range of 5 to 20 nm). The term "beam" is used to encompass various types of beams including beams of radiation and electrons.

The term mask, as used herein, can be broadly interpreted as referring to a structure comprising features that can be used to endow an incoming beam with a patterned cross-section, corresponding to a target pattern that is to be created in a target portion of a substrate.

The term mask layout, as used herein, can be broadly interpreted as referring to an arrangement of features, where the arrangement of features defines a structure or structures to be formed in the substrate.

The term feature, as used herein, can be broadly interpreted as referring to a geometric design made up of various features on a mask layout. A feature can be a real feature or a virtual feature.

The term real feature, as used herein, can be broadly interpreted as referring to a feature that eventually results in a structure being imaged on the substrate. The real feature can be used in program code that is used to generate a mask layout. According to various embodiments, a real feature can generate a structure such as a contact hole, a via, a gate, an interconnect line, or the like formed on the substrate. Real features can further include sub-resolution assist features (SRAFs).

The term virtual feature, as used herein, can be broadly interpreted as referring to a feature that is used to correct for forbidden pitch. The virtual feature can also be used in program code that is used to generate a mask layout. According to various embodiments, a virtual feature is a feature that can be removed or replaced in the mask layout before the mask layout is transformed into an actual mask. The virtual feature may or may not actually form a structure on the substrate.

According to various embodiments, a non-transitory computer readable storage medium can be used to generate a mask of a mask layout. The computer readable medium can comprise program code that can configure a processor to use real features and virtual features to generate the mask layout having a pitch that otherwise would be a forbidden pitch. A computer readable medium can use the mask layout to generate a mask that can then be used to image the substrate.

For example, FIG. 1 shows a portion of a mask layout 100 comprising a first feature 110, additional features 112, 114, 116, and 118 adjacent to the first feature 110, and a set of areas 142, 144, 146, and 148 adjacent to the first feature 110. In the exemplary embodiment shown in FIG. 1, the feature 110 is a real feature. Further, in the embodiment shown in FIG. 1, the features 112, 114, and 116 are also real features while feature 118 is a virtual feature. As shown in FIG. 1, the real feature 110 can be positioned along a first axis 120, such as an x-axis, and along a second axis 130, such as a y-axis.

According to various embodiments, a distance (d) away from the feature 110 can be determined where other patterns (i.e., a real pattern or a virtual pattern) can be placed. The distance (d) may or may not be a distance less than a forbidden pitch. According to various exemplary embodiments, the distance (d) can be a range from about 100 nm to about 250 nm away from pattern 110. According to further exemplary embodiments, the distance (d) can be a range from about 125 nm to about 200 nm, and in still further embodiments away from the feature, the distance (d) can be a range from about 150 nm to about 190 nm away from feature 110. Moreover, the distance (d) can be a range that extends from a first radius ($r_1$) away from feature 110 to a second radius ($r_2$) away from the same feature, where ($r_1$) can be about less than about 150 nm away from feature 110 and ($r_2$) can be less than about 250 nm away from feature 110.

Also shown in FIG. 1 a first angle (θ) away from the first axis 120 can be defined and used as a measure of where to place the other features along the first axis 120, with respect to the target pattern 110. A second angle (φ) away from the second axis 130 can also be defined and used as a measure of where to place other features along the second axis 130 with, respect to the feature 110. According to various embodiments, second angle (φ) can span a similar distance away from the second axis as first angle (θ) can be from the first axis. In other embodiments, however, second angle (φ) can span a different distance away from the second axis as first angle (θ) spans from the first axis.

According to various exemplary embodiments, the first angle (θ) can span an arc of about ±20 degrees away from the first axis 120. According to further exemplary embodiments, the first angle (θ) can span an arc of about ±15 degrees away from the first axis 120, and in still further embodiments, the first angle (θ) can span an arc of about ±12 degrees away from the first axis 120.

According to various embodiments, the set of areas 142, 144, 146, and 148 can be adjacent to the feature 110 and are where other features can be placed so as to yield a satisfactory feature. Each areas in the of the set of areas 142, 144, 146, and 148 can be determined based on the distance (d) away from the feature 110 and the angle away from the corresponding axis with respect to the feature 110.

In FIG. 1, area 142 can include the region covering a distance from radius ($r_1$) to radius ($r_2$) away from feature 110 and span the arc of first angle (θ) surrounding the first axis 120. Similarly, area 148 can include the area covering a distance from radius ($r_1$) to radius ($r_2$) away from feature 110 and span the arc of second angle (φ) surrounding the second axis 130. Areas 144 and 146 can be similarly defined. In an exemplary embodiment, radius ($r_1$) is about 150 nm and radius ($r_2$) is about 190 nm away from feature 110 and first angle (θ) spans ±15 degrees away from the first axis 120.

Figure 2A:
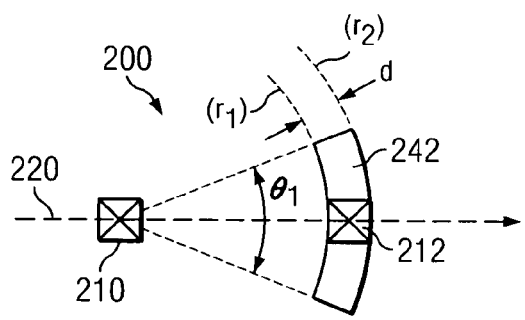
FIGS. 2A-2D depict portions of various exemplary mask layouts for use in forming an integrated circuit device according to various embodiments of the present invention.

According to various embodiments, a method of making a mask layout for forming contact holes is shown in FIGS. 2A-2D. FIG. 2A shows a portion of a mask layout 200 where a first feature 210 can be patterned along a first axis 220. A first area 242, such as from a first set of areas, can be determined adjacent to the first feature 210. The first area 242 can cover the region made from the area spanned by a first angle (θ) and from radius ($r_1$) to radius ($r_2$). The location of other areas can also be determined, as will be shown below. A second feature 212 can be patterned in the first area 242. According to various embodiments, features should be placed only in the determined areas. Features not placed in the determined areas may violate placement and forbidden pitch rules.

Figure 2B:
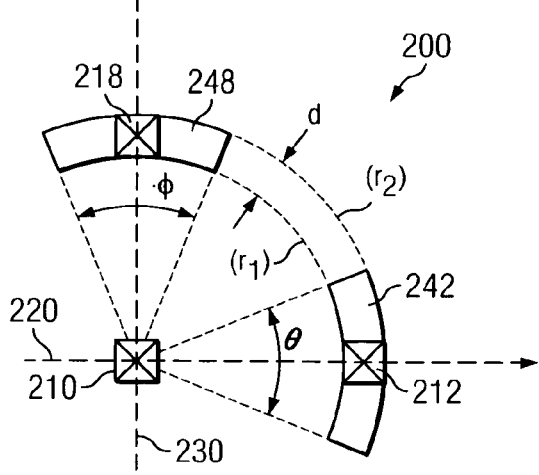

As shown in FIG. 2B, the first feature 210 can also be patterned along a second axis 230. The second axis 230 can be orthogonal to the first axis 220. Another area 248, such as from the first set of areas, can be also be determined adjacent to the first feature 210. The second area 248 can cover the region made from the area spanned by a second angle (φ) and from radius ($r_1$) to radius ($r_2$). According to various embodiments, first angle (θ) and second angle (φ) can be the same or different. Another second feature 218 can be patterned in area 248 to form the layout 200.

Figure 2C:
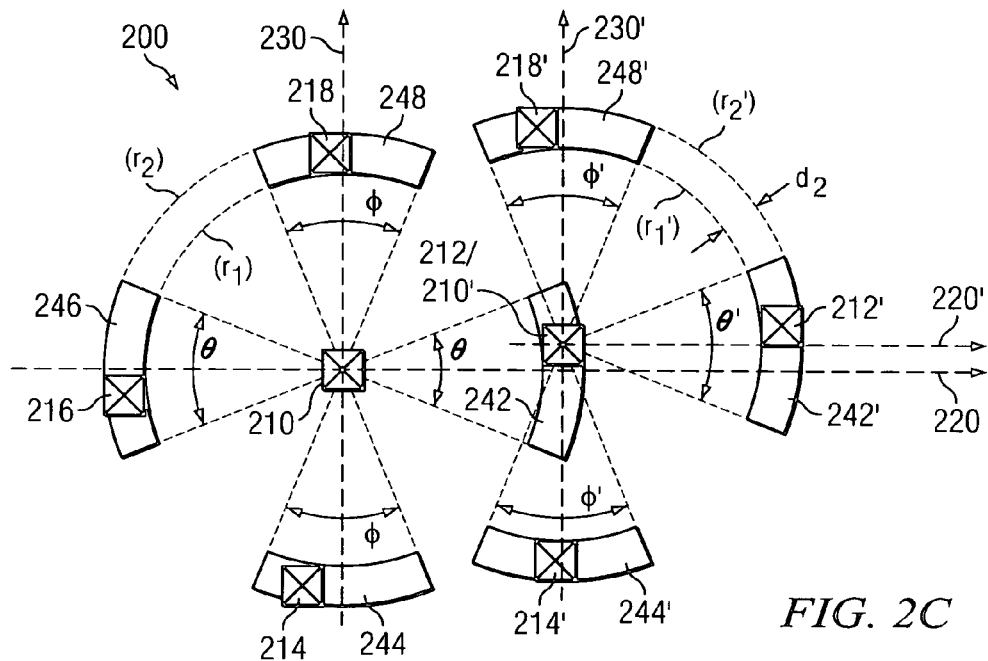

As shown in FIG. 2C, each of the areas in the first set of areas comprises a second feature. For example, second features 212, 214, 216, and 218 are positioned in areas 242, 244, 246, and 248, respectively. Further, the second feature 212 can also be patterned along a third axis 220' and a fourth axis 230'. According to various embodiments, the third axis 220' can be parallel to the first axis 220 and the fourth axis 230' can be parallel to the second axis 230. In certain embodiments, the first axis 220 and the third axis 220' can be the same axis and/or the second axis 230 and the fourth axis 230' can be the same axis.

Another set of areas, such as a second set of areas 242', 244', 246', and 248', can be determined adjacent to the second feature 212. Each of the areas in the second set of areas can cover a region made from the area spanned by an angle (θ') or an angle (φ') and from a radius ($r_1'$) to a radius ($r_2'$). According to various embodiments, first angle (θ') and second angle (φ') can be the same or different as each other and as the first angle (θ) and second angle (φ), respectively. Another set of features, such as third features 214', 216', and 218' can be patterned in areas 244', 246', and 248', respectively, to form a portion of the layout 200.

Figure 2D:
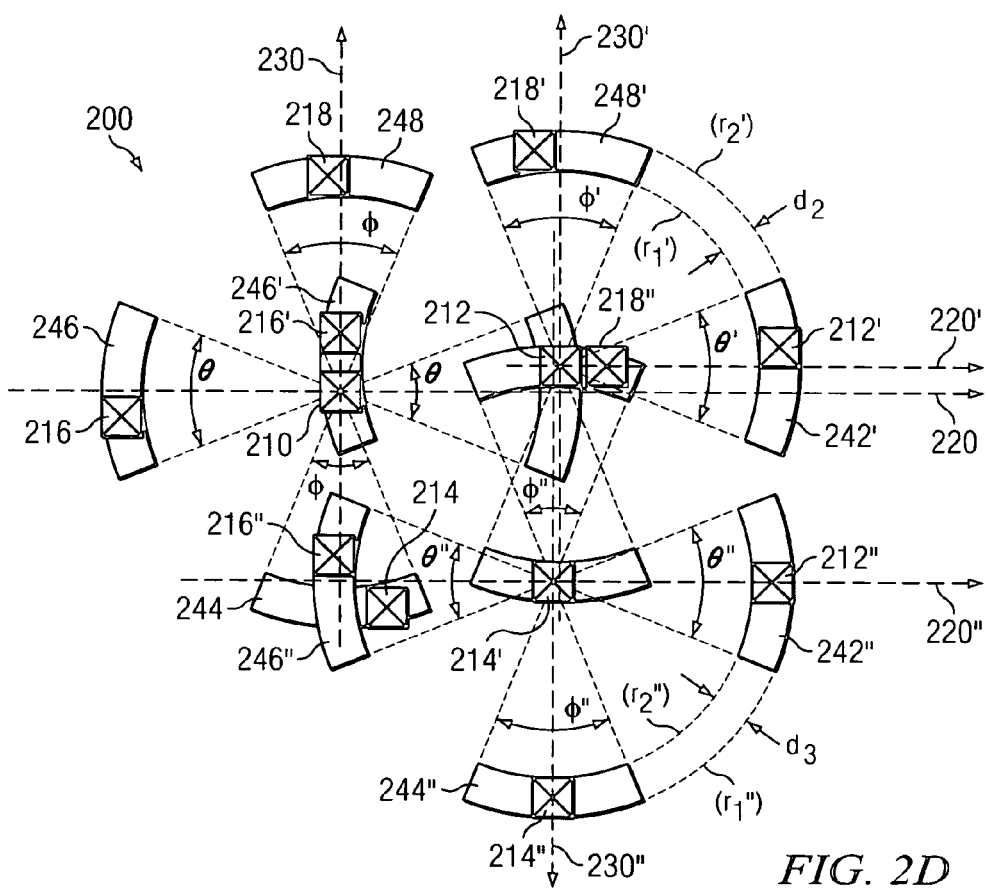

As shown in FIG. 2D, each of the areas in the first set of areas, and second set of areas comprises a feature. For example, features 212, 214, 216, and 218 are positioned in areas 242, 244, 246, and 248, respectively, and features 212', 214', 216', and 218' are positioned in areas 242', 244', 246', and 248', respectively. Further, the second feature 214' can also be patterned along a fifth axis 220" and a sixth axis 230". According to various embodiments, the fifth axis 220" can be parallel to the first axis 220 and the sixth axis 230" can be parallel to the second axis 230. In certain embodiments, the first axis 220 and the fifth axis 220" can be the same axis and/or the second axis 230 and the sixth axis 230" can be the same axis.

Another set of areas, such as a third set of areas 242", 244", 246", and 248", can be determined adjacent to the feature 214'. Each of the areas in the third set of areas can cover a region made from the area spanned by an angle (θ") or an angle (φ") and from a radius ($r_1''$) to a radius ($r_2''$). According to various embodiments, angle (θ") and angle (φ") can be the same or different as each other and as the first angle (θ) and second angle (φ), respectively. Another set of features, such as fourth features 212", 214", 216", and 218" can be patterned in areas 242", 244", 246", and 248", respectively, to form a portion of the layout 200.

In certain instances, areas adjacent to various features can overlap. For example, in FIG. 2D, area 244 overlaps area 246" and a feature can be placed in each of the areas. In this case, feature 214 is patterned in area 244 and feature 216" is patterned in area 246". Again, features should be placed only in the determined areas. Features not placed in the determined areas may violate placement and forbidden pitch rules.

Figure 3A:
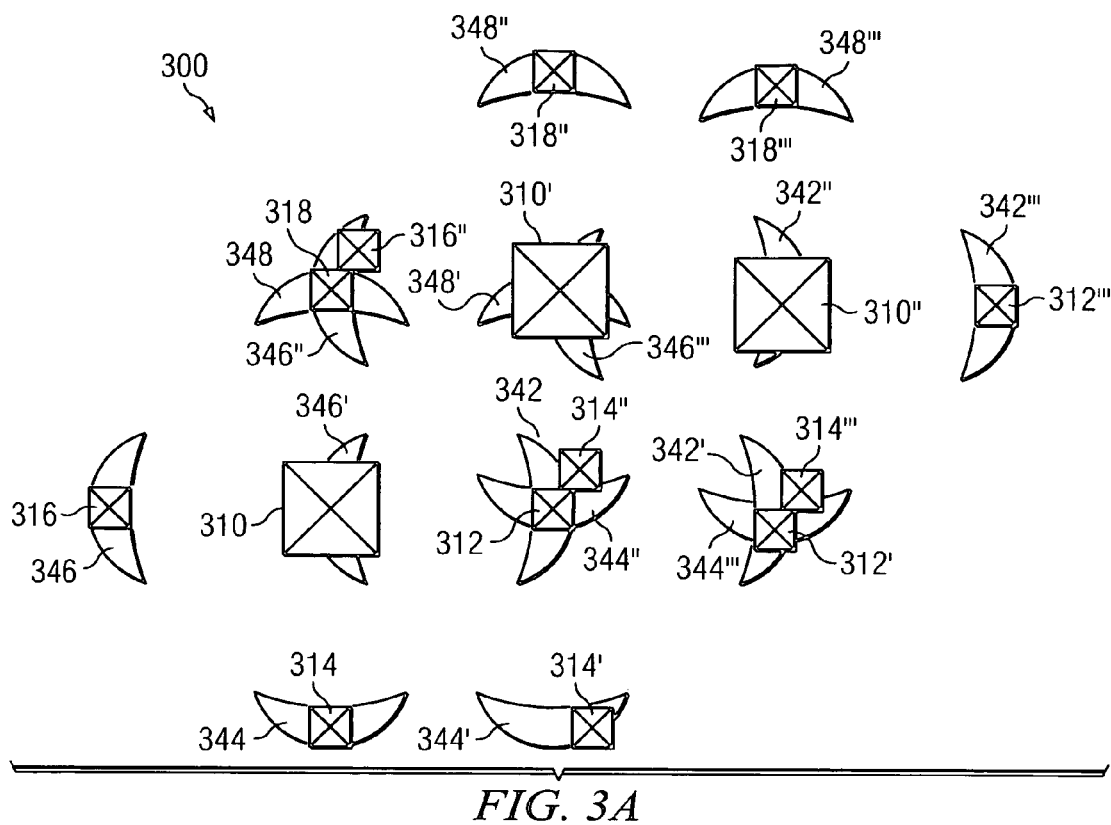
FIGS. 3A-3B depict portions of still further exemplary mask layouts for use in forming an integrated circuit device according to various embodiments of the present invention.

According to various embodiments, features defining a contact hole can be placed on each of the real features on the layout 200 and in some cases, sub-resolution assist features (SRAFs) can be placed on each of the virtual features on the layout 200. For example, FIG. 3A shows a portion of a layout 300 comprising a first feature 310 surrounded by a first set of areas 342, 344, 346, and 348. In each of the first set of areas 342, 344, 346, and 348 is patterned a virtual feature, 312, 314, 316, and 318, respectively. A second set of areas 342', 344', 346', and 348' can be determined to be adjacent to the virtual feature 312. Virtual features 312' and 314' are patterned in areas 342' and 344', respectively. In example, real features 310 and 310' are patterned in areas 346' and 348', respectively. Next, a third set of areas 342", 344", 346", and 348" can be determined to be adjacent to real feature 310'. A real feature 310" can be patterned in area 342" and virtual features 314", 316", and 318" can be patterned in areas 344", 346", and 348", respectively. Moreover, a forth set of areas 342'", 344'", 346'", and 348'" can be determined to be adjacent to the real feature 310". Real feature 310' is already patterned in area 346'". Virtual features 312'", 314'", and 318'" are then patterned in areas 342'", 344'", and 348'", respectively.

Figure 3B:
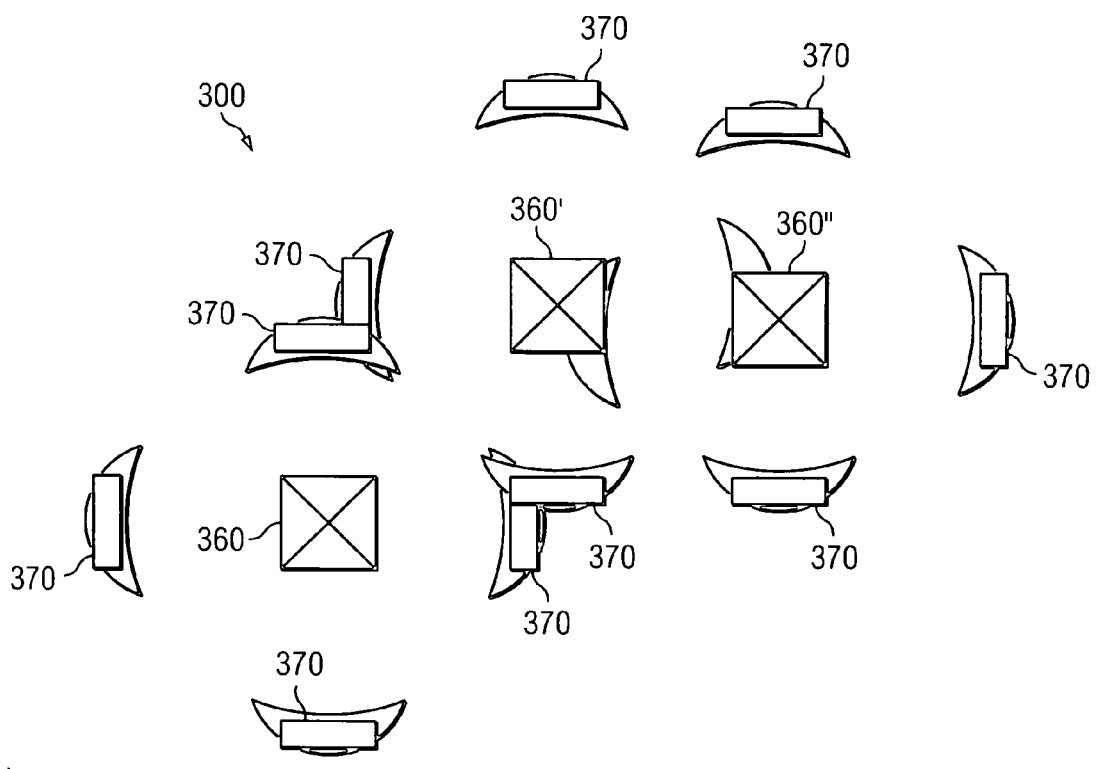

As shown in FIG. 3B, contact hole features 360, 360', and 360" are patterned on real features 310, 310', and 310", respectively. SRAFs 370 are patterned in each of the other areas where virtual features were patterned. In cases where the areas overlapped, SRAFs 370 in close proximity or touching each other can be formed.

According to various embodiments, the areas adjacent to a feature can form various shapes. For example the areas can form segments of a toroid (shown for example in FIGS. 2A-2D, or the areas can form truncated circles (shown for example in FIGS. 3A-3B). Other areas are also contemplated.

Figure 4:
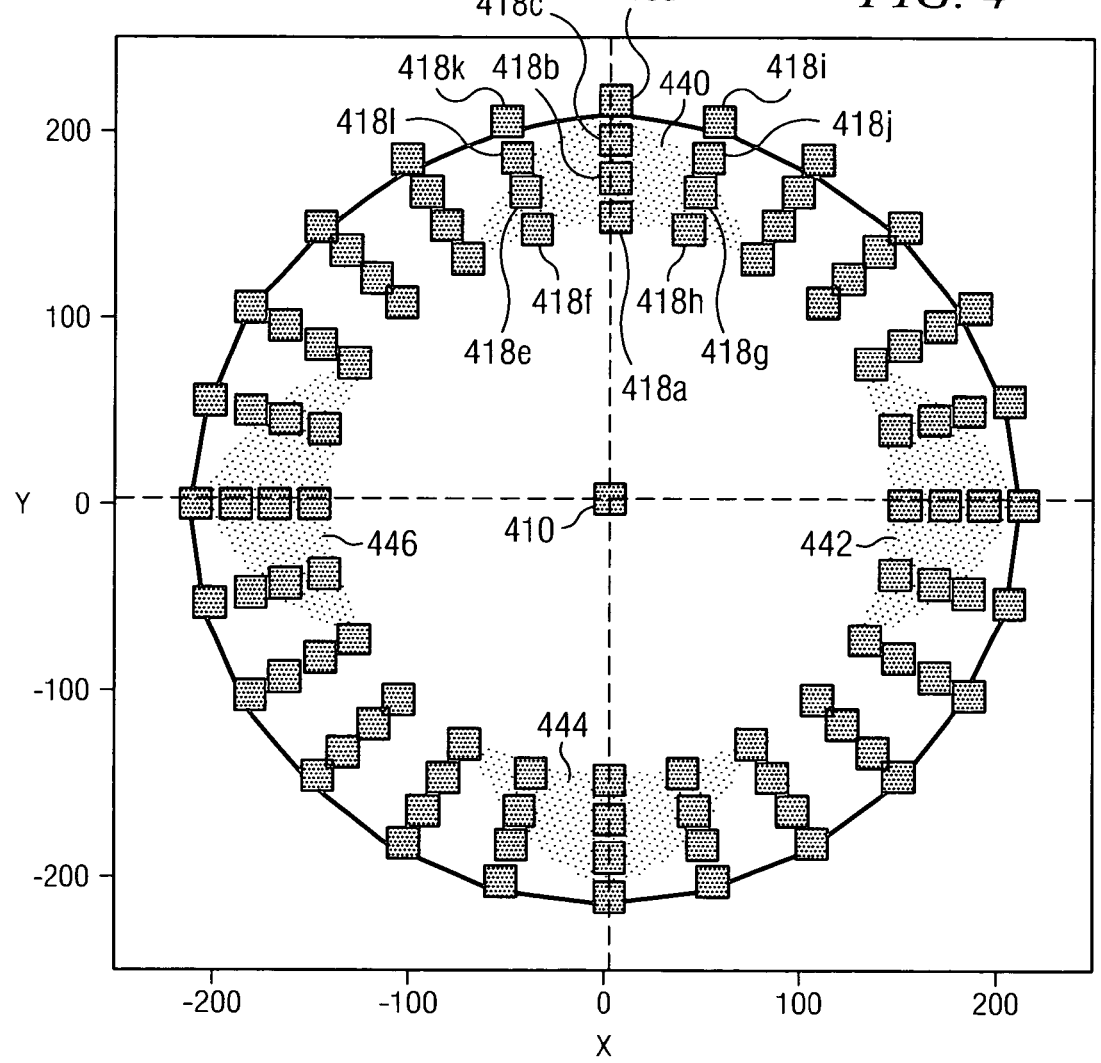
FIG. 4 depicts a diagram of where features can be placed on a mask layout according to various embodiments of the present invention.

Another embodiment of where additional mask features can be placed with respect to a first feature is shown in FIG. 4. FIG. 4 shows a diagram 400 comprising a first feature 410 around which other features can be placed. The diagram 400 includes areas 440, 442, 444, and 446 positioned along a first axis X and a second axis Y. In the diagram 400, the areas 440, 442, 444, and 446 form cone shaped regions positioned along the respective axis. Placing additional features anywhere in these cone areas permits accurate contact hole patterning on a substrate. For example, features 418a-418h are shown to reside within area 440 and as such, permit accurate contact hole patterning on a substrate. Features 418i-418l, however, are outside of area 440 and as such, do not form accurate contact hole structures on a substrate.

Figure 5:
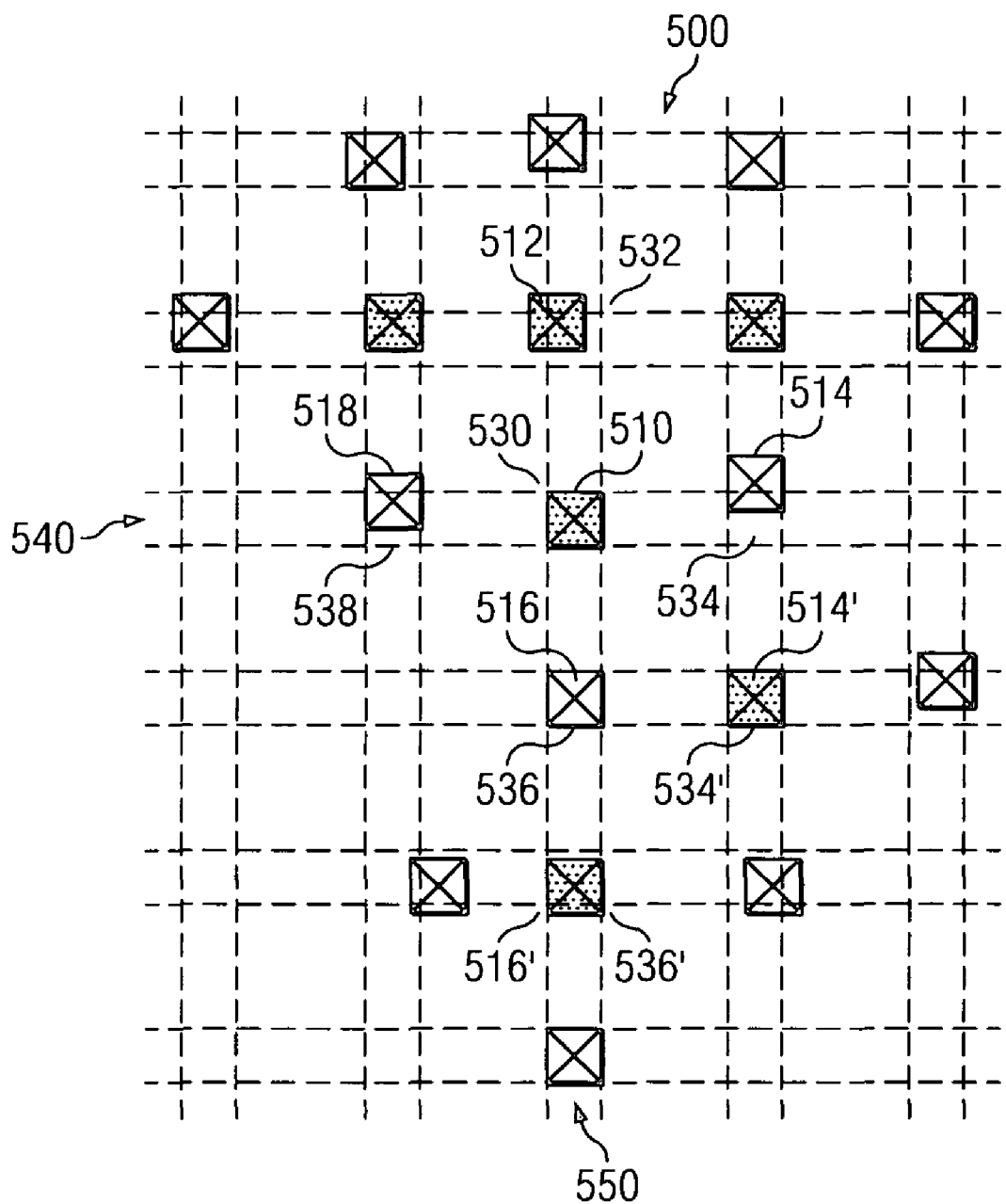
FIG. 5 depicts a portion of yet another exemplary mask layout for use in forming an integrated circuit device according to various embodiments of the present invention.
Figure 5:
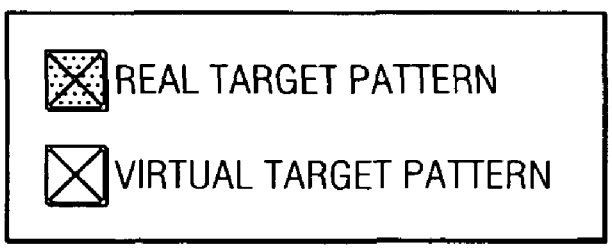

FIG. 5 shows a portion 500 of a layout that can be used to form contacts on a substrate. Portion 500 comprises a plurality of features that include real features 510 and virtual features 520. According to various embodiments, as shown for example in FIG. 5, all of the features in portion 500 are not positioned exactly in columns or rows. Rather, the features can be located within an area surrounding an intersection of a row and a column. In other embodiments, however, the features can be arranged in a gridded layout pattern (not shown) such that each feature is positioned exactly at the intersection of a row and a column.

In an exemplary embodiment, a real feature 510 can be defined to be located at an intersection 530 of a row 540 and a column 550. Typically, a designer would run into forbidden pitch problems when attempting to form a contact hole at another row/column intersection. However, by placing a real feature or a virtual feature in each of the areas surrounding an intersection, and then patterning a feature defining a contact hole or an SRAF on the real feature and virtual features, respectively, accurate contact holes can be achieved on a substrate.

In the example shown in FIG. 5, a real feature 512 is placed in the area 532 adjacent to the intersection 530 and virtual features are placed in each of the areas surrounding the intersections 534, 536, and 538. In this example, the virtual features 514, 516, and 518 need not actually be patterned onto the mask or the substrate. The virtual features 514, 516, and 518, however, can have SRAFs patterned thereon to allow the designer to account for and cope with forbidden pitch problems, thereby allowing accurate patterning of contact holes on the substrate.

In FIG. 5, additional features adjacent to virtual feature 516 permits accurate contact hole patterning on other regions of the substrate. For example, features, such as real features 514' and 516' are placed in the areas surrounding the intersections 534' and 536', respectively, and a virtual feature 518' is placed in the area surrounding the intersection 538'.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making a mask layout for forming contact holes on a semiconductor device, the method comprising:
    patterning a first feature along a first axis;
    determining a first set of areas adjacent to the first feature, wherein each of the areas in the first set of areas is within a first angle away from the first axis, and wherein each of the areas in the first set of areas is within a first distance away from the first feature; and
        patterning a second feature in at least one of the first set of areas so as to form a mask layout, wherein each of the first feature and the second feature are one of a virtual feature and a real feature.

2. The method of making a mask layout for forming contact holes on a semiconductor device according to claim 1 further comprising:
    pattering the first feature along a second axis, and
    wherein each of the areas in the first set of areas adjacent to the first feature are within the first angle away from the second axis.

3. The method of making a mask layout for forming contact holes on a semiconductor device according to claim 2 further comprising:
    determining a second set of areas adjacent to the second feature, wherein each of the areas in the second set of areas is within a second angle away from a third axis, wherein the third axis is parallel to one of the first axis and the second axis, and wherein each of the areas in the second set of areas is within a second distance away from the second feature; and
    patterning a third feature in at least one of the second set of areas, wherein the third feature is one of the virtual feature and the real feature.

4. The method of making a mask layout for forming contact holes on a semiconductor device according to claim 3 further comprising:
    determining a third set of areas adjacent to the third feature, wherein each of the areas in the third set of areas is within a third angle away from a fourth axis, wherein the fourth axis is parallel to one of the first axis and the second axis, and wherein each of the areas in the third set of areas is within a third distance away from the third feature.

5. The method of making a mask layout for forming contact holes on a semiconductor device according to claim 4 further comprising:
    patterning at least one of the real feature and the virtual feature in each of the areas in the first set of areas, the second set of areas, and the third set of areas.

6. The method of making a mask layout for forming contact holes on a semiconductor device according to claim 2, wherein the second axis is orthogonal to the first axis.

7. The method of making a mask layout for forming contact holes on a semiconductor device according to claim 1, wherein the first angle is between ±15 degrees.

8. The method of making a mask layout for forming contact holes on a semiconductor device according to claim 1, wherein the first distance is from about 100 nm to about 200 nm.

9. The method of making a mask layout for forming contact holes on a semiconductor device according to claim 2, wherein each of the first set of areas is from about 100 nm to about 200 nm away from the first target feature and is between ±15 degrees away from at least one of the first axis and the second axis.

10. The method of making a mask layout for forming contact holes on a semiconductor device according to claim 4, wherein the first angle is substantially similar to the second angle, and wherein the second angle is substantially similar to the third angle.

11. The method of making a mask layout for forming contact holes on a semiconductor device according to claim 4, wherein the first distance is substantially similar to the second distance, and wherein the second distance is substantially similar to the third distance.

12. The method of making a mask layout for forming contact holes on a semiconductor device according to claim 4, wherein one of the first set of areas overlaps a portion of one of the third set of areas.

13. The method of making a mask layout for forming contact holes on a semiconductor device according to claim 5, wherein a contact hole feature is placed in areas having real features.

14. The method of making a mask layout for forming contact holes on a semiconductor device according to claim 13, wherein a sub-resolution assist feature is placed in areas having virtual features.

15. The method of making a mask layout for forming contact holes on a semiconductor device according to claim 4, wherein each of the areas has a shape of a truncated circle.

16. A method of making a mask layout, the method comprising:
    positioning a plurality of features on a layout, wherein the plurality of features comprises
    a first feature, wherein the first feature is positioned along a first axis and a second axis orthogonal to the first axis, and
    a plurality of additional features, wherein each of the additional features is positioned on an axis parallel to the first axis and on an axis parallel to the second axis;
    determining a first set of areas adjacent to the first feature, wherein each of the areas in the first set of areas is defined by a distance (d1) to a distance (d2) away from the first feature and within a first angle away from one of the first axis and the second axis, and wherein each one of the areas in the first set of areas comprises one of the plurality of additional features; and
    patterning one of a contact hole feature and a sub-resolution assist feature (SRAF) in the position of the first feature and the additional features.

17. The method of making a mask layout according to claim 16 further comprising:
    determining additional sets of areas adjacent to each of the additional features, wherein each of the areas in the additional sets of areas is defined by the distance (d1) to the distance (d2) away from the corresponding additional feature and within the first angle away from one of the additional axis parallel to the first axis and the additional axis parallel to the second axis, and wherein each one of the areas in the additional set of areas comprises one of the plurality of additional features.

18. The method of making a mask layout according to claim 17, wherein the distance (d1) is about 100 nm and the distance (d2) is about 200 nm, and wherein the first angle is from ±15 degrees away from the corresponding axis.

19. The method of making a mask layout according to claim 17, wherein the second axis is orthogonal to the first axis.

20. The method of making a mask layout according to claim 16, wherein each of the areas has a shape of a truncated circle.

21. The method of making a mask layout according to claim 16 further comprising:

storing the mask design on a computer readable medium.

22. The method of making a mask layout according to claim 16, wherein the method is done using a computer readable medium.

23. A non-transitory computer readable storage medium containing executable program code stored thereon, wherein the program code instructs a processor to perform a method of making a mask layout for forming contact holes on a semiconductor device including the following steps:

patterning a first feature along a first axis;

determining a first set of areas adjacent to the first feature, wherein each of the areas in the first set of areas is within a first angle away from the first axis, and wherein each of the areas in the first set of areas is within a first distance away from the first feature; and patterning a second feature in at least one of the first set of areas so as to form a mask layout, wherein each of the first feature and the second feature are one of a virtual feature and a real feature.

24. The computer readable medium containing program code according to claim 23, wherein the program code instructs the processor to perform the method further including the following step:

pattering the first feature along a second axis, wherein each of the areas in the first set of areas adjacent to the first feature are within the first angle away from the second axis.

25. The computer readable medium containing program code according to claim 24, wherein the program code instructs the processor to perform the method further including the following steps:

determining a second set of areas adjacent to the second feature, wherein each of the areas in the second set of areas is within a second angle away from a third axis, wherein the third axis is parallel to one of the first axis and the second axis, and wherein each of the areas in the second set of areas is within a second distance away from the second feature; and patterning a third feature in at least one of the second set of areas, wherein the third feature is one of the virtual feature and the real feature.

26. The computer readable medium containing program code according to claim 25, wherein the program code instructs the processor to perform the method further including the following step:

determining a third set of areas adjacent to the third feature, wherein each of the areas in the third set of areas is within a third angle away from a fourth axis, wherein the fourth axis is parallel to one of the first axis and the second axis, and wherein each of the areas in the third set of areas is within a third distance away from the third feature.

27. The computer readable medium containing program code according to claim 26, wherein the program code instructs the processor to perform the method further including the following step:

patterning at least one of the real feature and the virtual feature in each of the areas in the first set of areas, the second set of areas, and the third set of areas.

28. The computer readable medium containing program code according to claim 23, wherein the first angle is between ±15 degrees.

29. The computer readable medium containing program code according to claim 23, wherein the first distance is from about 100 nm to about 200 nm.

30. A mask for use in the manufacture of an integrated circuit, the mask comprising:

a transparent substrate having a mask design, the mask design comprising, a first feature to be imaged on a substrate, wherein the first feature is positioned along a first axis and a second axis; and a second feature, wherein the second feature is positioned from about 100 nm to about 200 nm away from the first feature, and wherein the second feature is positioned from about ±15 degrees from one of the first axis and the second axis, and wherein the second feature is one of a sub-resolution assist feature and a feature to be imaged on the substrate.

31. The mask for use in the manufacture of an integrated circuit according to claim 30, wherein the second axis is orthogonal to the first axis.

32. The mask for use in the manufacture of an integrated circuit according to claim 30, wherein the first feature and the second feature form contact holes on the substrate.

\* \* \* \* \*